United States Patent [19]
Acello

[11] Patent Number: 5,304,429
[45] Date of Patent: Apr. 19, 1994

[54] SEMICONDUCTOR DEVICES HAVING COPPER TERMINAL LEADS

[75] Inventor: Salvatore J. Acello, St. James, N.Y.

[73] Assignee: General Instrument Corporation, Hatboro, Pa.

[21] Appl. No.: 856,715

[22] Filed: Mar. 24, 1992

[51] Int. Cl.$^5$ .................. H01L 23/28; H01L 23/49
[52] U.S. Cl. .................................. 428/620; 257/694; 257/784
[58] Field of Search ............... 428/620, 641, 630, 621, 428/674; 257/741, 762, 784, 694, 790, 794; 228/155

[56] References Cited

U.S. PATENT DOCUMENTS

| | | | |
|---|---|---|---|
| 3,050,666 | 8/1962 | Stump | 257/694 |
| 3,197,843 | 8/1965 | Nippert | 228/155 |
| 3,282,748 | 11/1966 | Martens | 228/155 |
| 3,787,966 | 1/1974 | Klossika | 257/764 |
| 3,996,602 | 12/1976 | Goldberg et al. | 257/790 |
| 4,149,310 | 4/1979 | Nippert | 228/155 |
| 4,423,618 | 1/1984 | Clarke | 228/155 |
| 5,101,263 | 3/1992 | Kitano et al. | 257/784 |

OTHER PUBLICATIONS

Metal Handbook, 9th Ed., vol. 2, "Properties and Selection: Nonferrous Alloys and Pure Metals", American Society for Metals, 1974, pp. 239-241.

Primary Examiner—John Zimmerman

[57] ABSTRACT

In a semiconductor device comprising a copper lead brazed to a metal member of the device in a thermal process causing annealing and undesirable softening of the lead, the lead is stiffened in a process comprising applying a tensile force along the length of the lead and between it and the member to which it is brazed for stretching the lead beyond its elastic limit. The stretching process causes sitffening of the lead, removes bends in the lead, if present, and serves as a test for defective brazed joints.

5 Claims, 1 Drawing Sheet

SEMICONDUCTOR DEVICES HAVING COPPER TERMINAL LEADS

BACKGROUND OF THE INVENTION

This invention relates to semiconductor devices and to the fabrication thereof, and particularly to semiconductor devices having terminal leads of copper.

One type of semiconductor device with which the present invention has utility is shown in U.S. Pat. No. 3,996,602, the subject matter of which is incorporated herein by reference.

This patent shows a semiconductor chip which is brazed between two molybdenum blocks and a pair of copper terminal leads brazed to respective ones of the blocks. The leads are co-axial, and extend in opposite directions from the molybdenum blocks.

In the assembly of the device, the chip, blocks and terminal leads are simultaneously brazed in a batch processing step in which a plurality of assembled devices are passed through a heating oven.

Copper is used for the terminal leads because of the high electrical and thermal conductivities thereof. The copper leads, which may comprise simple lengths of straight wire or leads of the "nail-head" type, i.e., having a radial flange at the ends brazed to the molybdenum blocks, are formed by known cold working methods including drawing the copper wire through a die. Such cold working, as known, tends to stiffen the normally relatively soft copper leads. However, during the batch brazing process, the copper leads are heated to a temperature, e.g., around 700 degrees Cent., which is sufficiently high to cause annealing and softening of the copper leads. The leads are thus easily bent which leads to numerous problems such as lead entanglement when the devices are bulk handled, and the need to straighten the leads for device testing and assembly into end use equipment.

Solutions in the past to the problems associated with soft terminal leads have generally relied upon more careful handling, and in some instances, individual rather than bulk processing and transporting of the devices. Such solutions are undesirable as increasing the cost of the devices.

SUMMARY OF THE INVENTION

In the devices of the type described, comprising elongated copper terminal leads brazed to other members of the device, and having been annealed and softened in the brazing process, the terminal leads of the assembled devices are stiffened and straightened by applying a tensile stress along the lengths of the leads for stretching the leads beyond their elastic limit.

In one embodiment of the invention, the devices being assembled are first brazed together, partially glass encapsulated, lead stretched and then plastic encapsulated. As described hereinafter, in this sequence of steps, the step of stretching the leads also serves as a cost effective means for testing the soundness of the brazed joints of the device.

DESCRIPTION OF THE PREFERRED EMBODIMENTS

Figure 1:
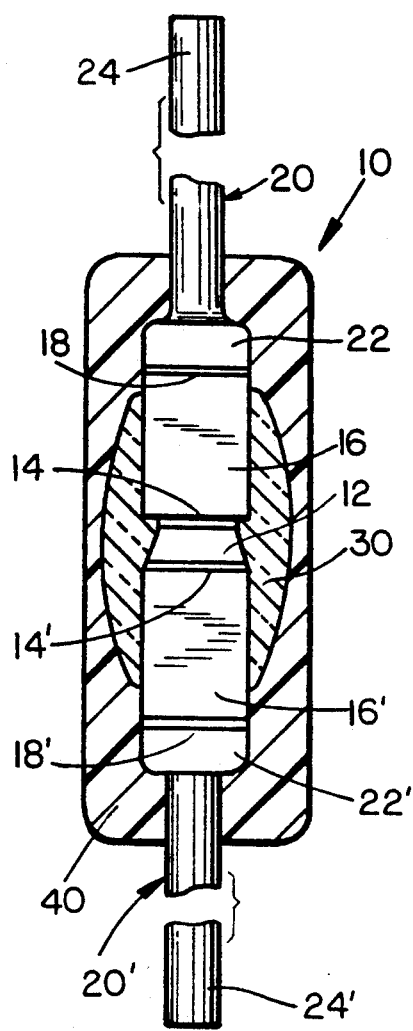
FIG. 1 is a side elevation view, partially in cross-section, of a semiconductive device of the type with which the present invention has utility.
Figure 3:
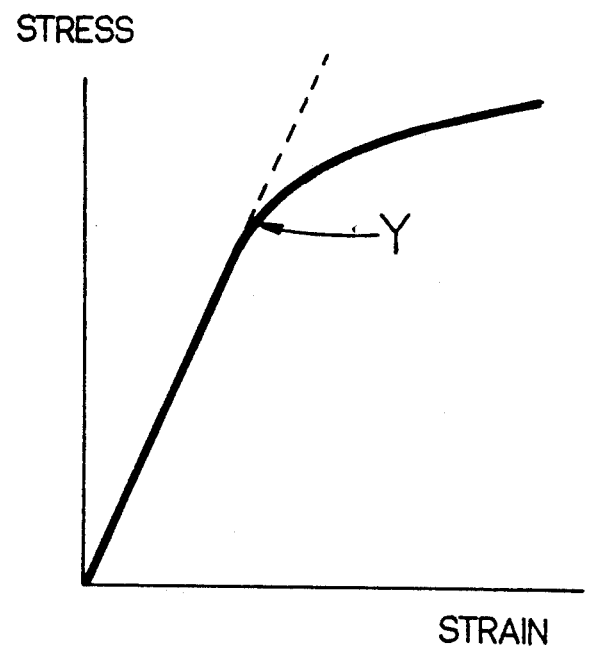
FIG. 3 is a typical stress-strain curve for metals.

With reference to FIG. 1 (corresponding to FIG. 3 of U.S. Pat. No. 3,996,602), one example of a semiconductor device 10 with which the present invention can be used comprises a semiconductor body 12 brazed by means of brazed joints 14 and 14' between two slugs 16 and 16' of molybdenum. Copper terminal leads 20 and 20' are brazed to the slugs by means of brazed joints 18 and 18'. In this device, the terminal leads include enlarged heads 22 and 22'.

The semiconductor body 12 and portions of the slugs 16 and 16' adjacent thereto are encapsulated in a glass passivating layer 30. The glass encapsulated portion, as well as the brazed ends of the terminal leads, are encapsulated in a plastic layer 40.

In the brazing together of the device 10, the semiconductive body 12, the slugs 16 and 16', and the terminal leads 20 and 20' are asssembled within a jig, and batches of assembled devices are passed through an oven at a temperature of around 700 degrees Cent. At this temperature, annealing of the copper of the terminal leads occurs and, regardless of any prior cold working of the copper leads, the copper reverts to the softness of unworked copper. By the term, "brazing", is also meant "soldering". In general, and depending upon the particular devices involved, any heating of copper above a temperature of around 250 degrees Cent. during brazing or other thermal processing will cause softening thereof.

In the illustrative devices, the terminal leads are essentially pure copper. The leads can also comprise alloys of copper, some of which include metals such as nickel, palladium, platinum and zinc to increase the stiffness thereof. Even such increased stiffness copper alloys are subject to annealing and softening, however, and, in general, the present invention has utility with such and similar copper alloy terminal leads.

As previously described, problems caused by the softened copper terminal leads are that they are easily bent giving rise to lead entanglements when the devices are bulk handled, and requiring individual straightening of the bent leads for testing and end use mounting.

Figure 2:
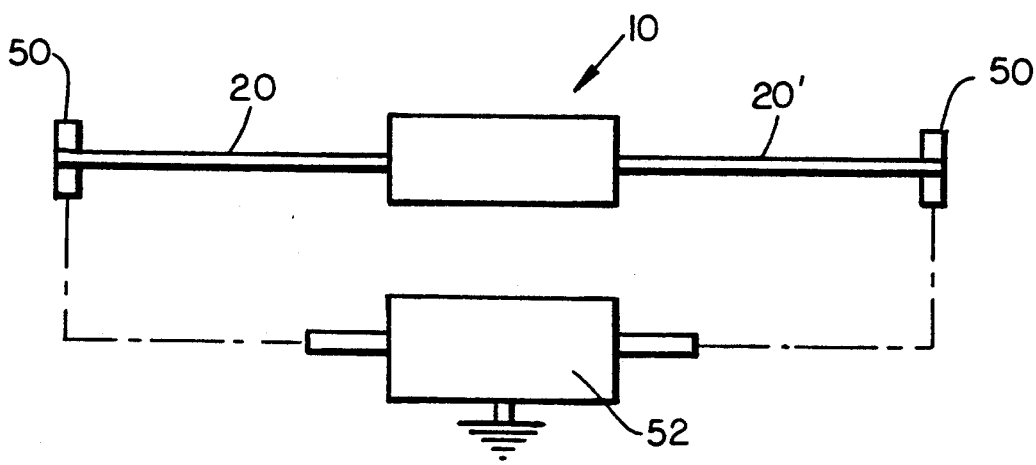
FIG. 2 is a schematic view of an apparatus for stretching the leads of the device shown in FIG. 1.

In accordance with this invention, for the purpose of stiffening the copper leads of the brazed devices as well as for straigtening previously bent leads, the leads are stretched using a known apparatus of the type shown schemtically in FIG. 2. The outer ends of the leads are clamped within clamps 50 and the clamps are moved apart, e.g., by hydraulic means 52, for stretching the lead wires. Tensile forces are thus applied along the length of the leads, and between the leads and the slugs to which the leads are bonded.

In order to achieve cold-working and stiffening of the copper leads, the leads are stretched beyond the elastic limits thereof. By this is meant, in accordance with conventional terminology, a stretching or strain sufficient to cause a plastic deformation of the leads, whereby, upon release of the tensile stretching forces, the leads remain substantially at their stretched lengths.

In general, and with respect to FIG. 3, which shows the well-known stress-strain relationship for metals, plastic deformation begins to occur at the known "yield" point marked Y on the curve. Any stretching of the leads beyond this point (that is, to the right of the point Y along the curve) causes cold working and a generally proportionate stiffening of the wire. While this is desirable for solving the aforementioned problems associated with soft terminal leads, such stiffening, however, is accompanied by an increase in electrical resistance and a decrease in lead diameter. Thus, a selection of the extent of stretching must be made depending upon the desired results. Also, for stretching in excess of around 25% of the original length of the leads, it is found that non-uniform reductions in lead diameter, i.e., "localized necking", can occur. This is undesirable because, at the regions of extra large diameter reduction, the leads are particularly weak and subject to rupture.

In general, a preferred range of lead stretching is from around 6% (to obtain a useful degree of stiffening) to around 25% of the original length of the lead. Stiffness can be measured by known force vs. deflection measuring apparatus.

For example, with a terminal lead having a length of one inch (25.4 mm) from the end 22 brazed to the slug 16 to the point of entry into the clamp 50, a preferred stretching, and retained increase in lead length after stretching, is around 1/16 inch (1.6 mm).

Also, with leads having a diameter of between around 24 and 30 mils (0.6-0.7 mm), the aforementioned stretching causes a reduction of diameter of around 1 mil (0.02 mm). The reduction of diameter is also proportionate to the lead stretching. In general, stretching at the lower end of the range is preferred to minimize lead diameter reduction and excessive brittleness of the leads which, in some instances, are bent for socketing.

The stretching process also eliminates bends previously present in the leads. Bends as large as 90 degrees are completely removed.

A further advantage of the invention is that the process of stretching the leads also provides a test of the mechanical strength of the various brazed joints of the device. Normally, and particularly in devices of the type shown wherein the leads include enlarged heads 22 and 22', the brazed joints, including the joints between the semiconductor body 12 and the slugs 16 and 16', can withstand a tensile force large enough to rupture the leads. Thus, if all the brazed joints are properly formed, no rupture of the brazed joints will occur during lead stretching, whereas improperly brazed together devices will fail.

A particular significance of this relates to the fact that the pulling of leads for testing brazed joints is priorly known. However, because it was generally believed that plastic deformations of the leads are undesirable because of deleterious effects on grain boundaries and increased electrical resistance, the lead tensile forces used in such pull tests are considerably less than those used in the lead stretching of the present invention. Accordingly, the prior art testing is less severe and less effective than the testing provided by the inventive process. Moreover, as previously explained, I have discovered that some lead deformation, as described, is actually desirable for strengthening the leads in spite of the accompanying reduction in lead cross-sectional area.

Also, because of the relatively large lead stretching, the stretching is preferably performed prior to the encapsulation with the plastic layer 40. This is to prevent excessive straining of the layer 40 and rupture of the seal between the plastic material and the encapsulated device surfaces.

Further, by performing the lead stretching before the plastic encapsulation, the cost of the plastic encapsulating process is saved for those devices which fail during stretching and are discarded.

What is claimed is:

1. A semiconductor device comprising a copper terminal lead brazed to a member of the device, the device being made by a process including heating the lead to a temperature sufficient to cause annealing of the lead, and thereafter applying a tensile force along substantially the entire length of the lead and between it and the member to which it is brazed for stretching the lead to beyond its elastic limit for causing stiffening of the lead.

2. A device made by the process of claim 1 wherein said lead is stretched, during said stretching thereof, not beyond 25% of its original length.

3. A device made by the process of claim 1 including encapsulating a length of said member but not the lead brazed thereto in a glass layer, thereafter performing said lead stretching, and thereafter encapsulating the glass encapsulated member as well as a portion of the end of the lead brazed to said member.

4. A device according to claim 1 wherein said terminal lead is an elongated wire terminating in a flat plate perpendicular to the axis of elongation of said wire and having an area greater than the cross-sectional area of said wire, said device including a semiconductor chip having a flat surface, and said flat plate being bonded in full surface contact with said chip surface by means of a brazed joint having a strength greater than that of said wire, whereby said joint is not subject to rupture during said tensile force applying step.

5. A device according to claim 1 wherein said lead is stretched by said tensile force between 6-25% of the length thereof.

* * * * *